United States Patent
Shih et al.

(10) Patent No.: US 11,229,111 B2
(45) Date of Patent: Jan. 18, 2022

(54) METHOD OF OPERATING SEMICONDUCTOR APPARATUS AND SEMICONDUCTOR APPARATUS

(71) Applicant: TAIWAN SEMICONDUCTOR MANUFACTURING CO., LTD., Hsinchu (TW)

(72) Inventors: Po-Ming Shih, Changhua County (TW); Chi-Hung Liao, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/100,466

(22) Filed: Nov. 20, 2020

(65) Prior Publication Data

US 2021/0076479 A1    Mar. 11, 2021

Related U.S. Application Data

(63) Continuation of application No. 16/232,948, filed on Dec. 26, 2018, now Pat. No. 10,849,214.

(60) Provisional application No. 62/690,081, filed on Jun. 26, 2018.

(51) Int. Cl.
*H05G 2/00* (2006.01)
*G03F 7/20* (2006.01)

(52) U.S. Cl.
CPC ......... *H05G 2/006* (2013.01); *G03F 7/70033* (2013.01); *H05G 2/008* (2013.01); *H05G 2/005* (2013.01)

(58) Field of Classification Search
USPC ...................................... 250/504 R
See application file for complete search history.

(56) References Cited

U.S. PATENT DOCUMENTS

| | | | |
|---|---|---|---|
| 7,476,886 B2 | 1/2009 | Bykanov | |
| 8,067,756 B2 * | 11/2011 | Ueno | ............... H05G 2/008 250/504 R |
| 8,764,995 B2 | 7/2014 | Chang et al. | |
| 8,796,666 B1 | 8/2014 | Huang et al. | |
| 8,828,625 B2 | 9/2014 | Lu et al. | |
| 8,841,047 B2 | 9/2014 | Yu et al. | |
| 8,877,409 B2 | 11/2014 | Hsu et al. | |

(Continued)

OTHER PUBLICATIONS

Takenoshita et al., "Debris studies for the tin-based droplet laser-plasma EUV source"May 20, 2004.

(Continued)

*Primary Examiner* — Phillip A Johnston
(74) *Attorney, Agent, or Firm* — Maschoff Brennan (57) ABSTRACT

A method of operating a semiconductor apparatus includes generating, by a droplet generator, a target material droplet; receiving, by a catcher, the target material droplet, wherein the catcher has a first section and a second section, wherein the first section of the catcher is closer to the droplet generator than the second section of the catcher; and heating the second section of the catcher, wherein the first section of the catcher is longer than the second section of the catcher and is free of a heater, and heating the second section of the catcher is performed such that a temperature of the second section of the catcher is higher than a temperature of the first section of the catcher.

20 Claims, 8 Drawing Sheets

(56) References Cited

U.S. PATENT DOCUMENTS

| | | |
|---|---|---|
| 9,093,530 B2 | 4/2015 | Huang et al. |
| 9,184,054 B1 | 11/2015 | Huang et al. |
| 9,256,123 B2 | 9/2016 | Shih et al. |
| 9,529,268 B2 | 12/2016 | Chang et al. |
| 9,548,303 B2 | 1/2017 | Lee et al. |
| 10,295,916 B2* | 5/2019 | Mulder ............... G03F 7/70033 |
| 10,349,508 B2 | 7/2019 | Shiraishi |
| 10,849,214 B2* | 11/2020 | Shih ....................... H05G 2/008 |
| 2020/0124976 A1* | 4/2020 | Patel ................... G03F 7/70916 |

OTHER PUBLICATIONS

Assael et al., "Reference Data for the Density and Viscosity of Liquid Cadmium, Cobalt, Gallium, Indium, Mercury, Silicon, Thallium and Zinc" May 31, 2012.

* cited by examiner

METHOD OF OPERATING SEMICONDUCTOR APPARATUS AND SEMICONDUCTOR APPARATUS

PRIORITY CLAIM AND CROSS-REFERENCE

This present application is a continuation application of U.S. patent application Ser. No. 16/232,948, filed Dec. 26, 2018, now U.S. Pat. No. 10,849,214, issued Nov. 24, 2020, which claims priority to U.S. Provisional Application Ser. No. 62/690,081, filed on Jun. 26, 2018, all of which are herein incorporated by reference in their entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing. For example, higher resolution lithography processes have been developed. One lithography technique is extreme ultraviolet lithography (EUVL).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

Figure 1:
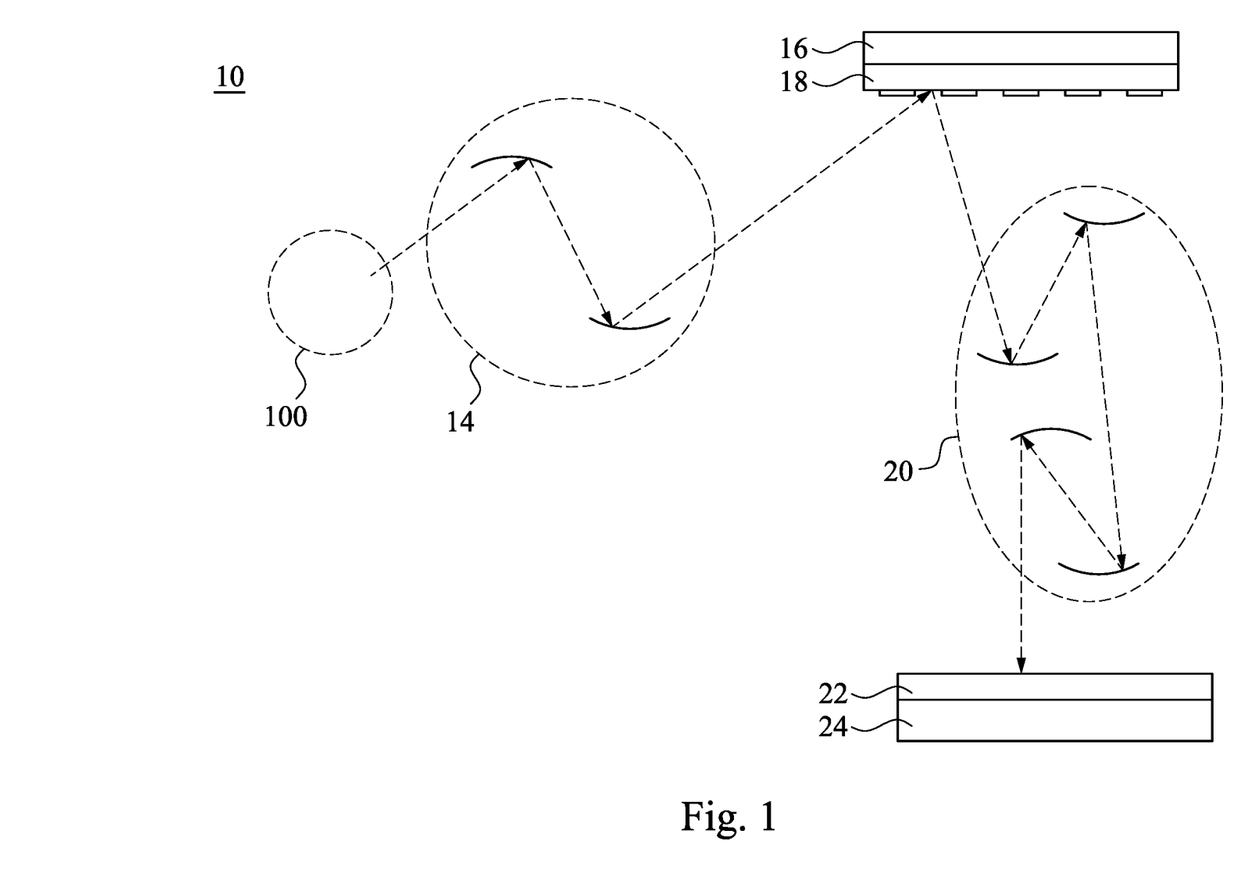
FIG. 1 is a schematic view of an extreme ultraviolet (EUV) lithography system in accordance with some embodiments of the present disclosure.

FIG. 1 is a schematic view of an extreme ultraviolet (EUV) lithography system 10 in accordance with some embodiments of the present disclosure. The lithography system 10 may also be generically referred to as a scanner that is operable to perform lithography exposing processes with respective radiation source and exposure mode. In some embodiments, the lithography system 10 is an extreme ultraviolet (EUV) lithography system designed to expose a resist layer by EUV light. The resist layer is a material sensitive to the EUV light. The EUV lithography system 10 employs a semiconductor apparatus 100 to generate EUV light, such as EUV light having a wavelength ranging between about 1 nm and about 100 nm. In some embodiments, the semiconductor apparatus 100 generates EUV light with a wavelength centered at about 13.5 nm. Accordingly, the semiconductor apparatus 100 is referred to as an EUV radiation source. In some embodiments, the semiconductor apparatus 100 utilizes a mechanism of laser-produced plasma (LPP) to generate the EUV radiation, which will be further described later.

The lithography system 10 also employs an illuminator 14. In various embodiments, the illuminator 14 includes various refractive optic components, such as a single lens or a lens system having multiple lenses (zone plates) or alternatively reflective optics (for EUV lithography system), such as a single mirror or a mirror system having multiple mirrors in order to direct light from the semiconductor apparatus 100 onto a mask stage 16, or onto a mask 18 secured on the mask stage 16. In some embodiments where the semiconductor apparatus 100 generates light in the EUV wavelength range, reflective optics is employed.

The lithography system 10 also includes the mask stage 16 configured to secure a mask 18. In some embodiments, the mask stage 16 includes an electrostatic chuck (e-chuck) to secure the mask 18. This is because that gas molecules absorb EUV light and the lithography system for the EUV lithography patterning is maintained in a vacuum environment to avoid the EUV intensity loss. In the present disclosure, the terms of mask, photomask, and reticle are used to refer to the same item. In some embodiments, the lithography system 10 is an EUV lithography system, and the mask 18 is a reflective mask. The mask 18 is provided for illustration. The mask 18 includes a substrate with a suitable material, such as a low thermal expansion material (LTEM) or fused quartz. In various examples, the LTEM includes $TiO_2$ doped $SiO_2$, or other suitable materials with low thermal expansion. The mask 18 includes a multiple reflective multiple layers (ML) deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light. The mask 18 may further include a capping layer, such as ruthenium (Ru), disposed on the ML for protection. The mask 18 further includes an absorption layer, such as a tantalum boron nitride (TaBN) layer, deposited over the ML. The absorption layer is patterned to define a layer of an integrated circuit (IC). Alternatively, another reflective layer may be deposited over the ML and is patterned to define a layer of an integrated circuit, thereby forming an EUV phase shift mask.

The lithography system 10 also includes a projection optics module (or projection optics box (POB) 20 for imaging the pattern of the mask 18 on to a semiconductor wafer 22 secured on a substrate stage 24 of the lithography system 10. The POB 20 has refractive optics (such as for UV lithography system) or alternatively reflective optics (such as for EUV lithography system) in various embodiments. The light directed from the mask 18, carrying the image of the pattern defined on the mask, is collected by the POB 20. The illuminator 14 and the POB 20 are collectively referred to an optical module of the lithography system 10.

The lithography system 10 also includes the substrate stage 24 to secure the semiconductor wafer 22. In some embodiments, the semiconductor wafer 22 may be a silicon wafer or other type of wafer to be patterned. The semiconductor wafer 22 is coated with the resist layer sensitive to the radiation beam, such as EUV light in some embodiments. Various components including those described above are integrated together and are operable to perform lithography exposing processes. The lithography system 10 may further include other modules or be integrated with (or be coupled with) other modules. In some embodiments, the lithography system 10 includes a gas supply module to provide hydrogen gas to the semiconductor apparatus 100.

Figure 2:
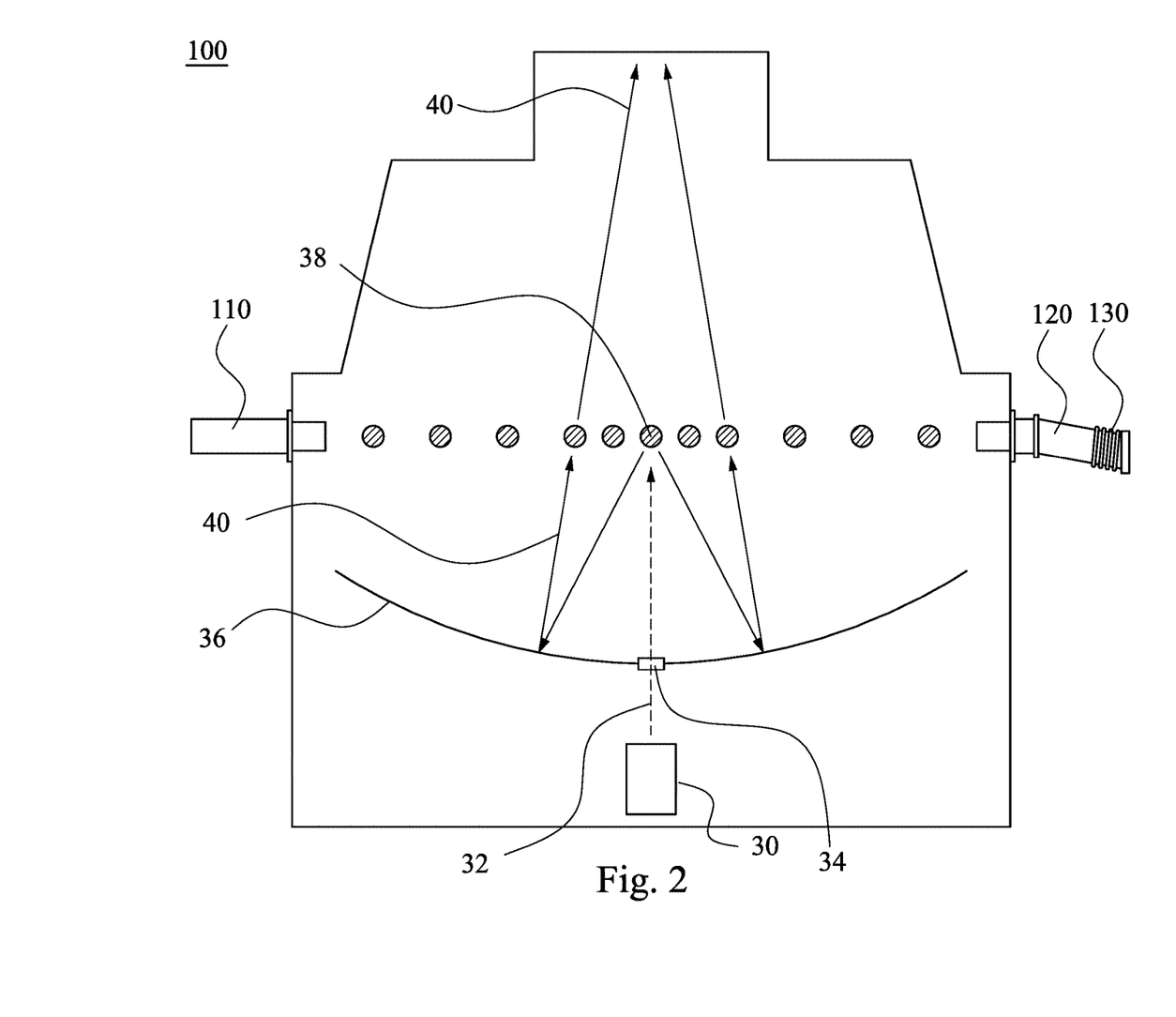
FIG. 2 is a side view of a semiconductor apparatus of FIG. 1.

FIG. 2 is a side view of the semiconductor apparatus 100 of FIG. 1. The semiconductor apparatus 100 includes a laser 30, a collector 36, a droplet generator 110, and a droplet catcher 120. The collector 36 is above the laser 30, and the droplet generator 110 and the droplet catcher 120 are above the collector 36. The droplet catcher 120 faces the droplet generator 110. The semiconductor apparatus 100 employs a laser produced plasma (LPP) mechanism to generate plasma and further generate EUV light from the plasma. The laser 30, such as pulse carbon dioxide (CO2) laser, is configured to generate a laser beam 32. The laser beam 32 is directed through an output window 34 integrated with the collector 36 (also referred to as LPP collector or EUV collector). The output window 34 adopts a suitable material substantially transparent to the laser beam. The collector 36 is designed with proper coating material and shape, functioning as a mirror for EUV collection, reflection and focus. In some embodiments, the collector 36 is designed to have an ellipsoidal geometry. In some embodiments, the coating material of the collector 36 is similar to the reflective multilayer of the EUV mask 18 (see FIG. 1). In some examples, the coating material of the collector 36 includes a ML (such as a plurality of Mo/Si film pairs) and may further include a capping layer (such as Ru) coated on the ML to substantially reflect the EUV light. In some embodiments, the collector 36 may further include a grating structure designed to effectively scatter the laser beam directed onto the collector 36. For example, a silicon nitride layer is coated on the collector 36 and is patterned to have a grating pattern.

The laser beam 32 is directed to heat target material droplets 38, such as tin droplets, thereby generating high-temperature plasma, which further produces EUV radiation 40 (or EUV light). The EUV radiation 40 is collected by the collector 36. The collector 36 further reflects and focuses the EUV radiation 40 for the lithography exposing processes. The laser beam 32 is focused to the target material droplets 38, such as tin droplets, thereby generating high-temperature plasma. The target material droplets 38 are generated by the droplet generator 110. The droplet catcher 120 is further configured to catch the target material droplets 38. Thus generated high-temperature plasma further produces EUV radiation 40, which is collected by the collector 36. The collector 36 further reflects and focuses the EUV radiation 40 for the lithography exposing processes. The pulses of the laser 30 and the droplet generating rate of the droplet generator 110 are controlled to be synchronized such that the target material droplets 38 receive peak powers consistently from the laser pulses of the laser 30. The laser 30 and the droplet generator 110 are turned on in a synchronized mode (the laser pulse and the tin generation rate are synchronized) through a suitable mechanism, such as a control circuit with timer to control and synchronize the both. In some embodiments, the EUV radiation 40 generated by the semiconductor apparatus 100 is illuminated on the mask 18 (by the illuminator 14), and is further projected on the resist layer coated on the wafer 22 (by the POB 20), thereby forming a latent image on the resist layer.

In addition, the semiconductor apparatus 100 is configured in an enclosed space (referred to as a source vessel). The source vessel is maintained in a vacuum environment since the air absorbs the EUV radiation 40. The semiconductor apparatus 100 may further be integrated with or coupled with other units/modules. For example, a gas supply module may be coupled with the semiconductor apparatus 100, thereby providing hydrogen gas to prevent the collector 36 from the contaminations of the target material droplets 38 (e.g., tin particles or tin debris).

Figure 3:
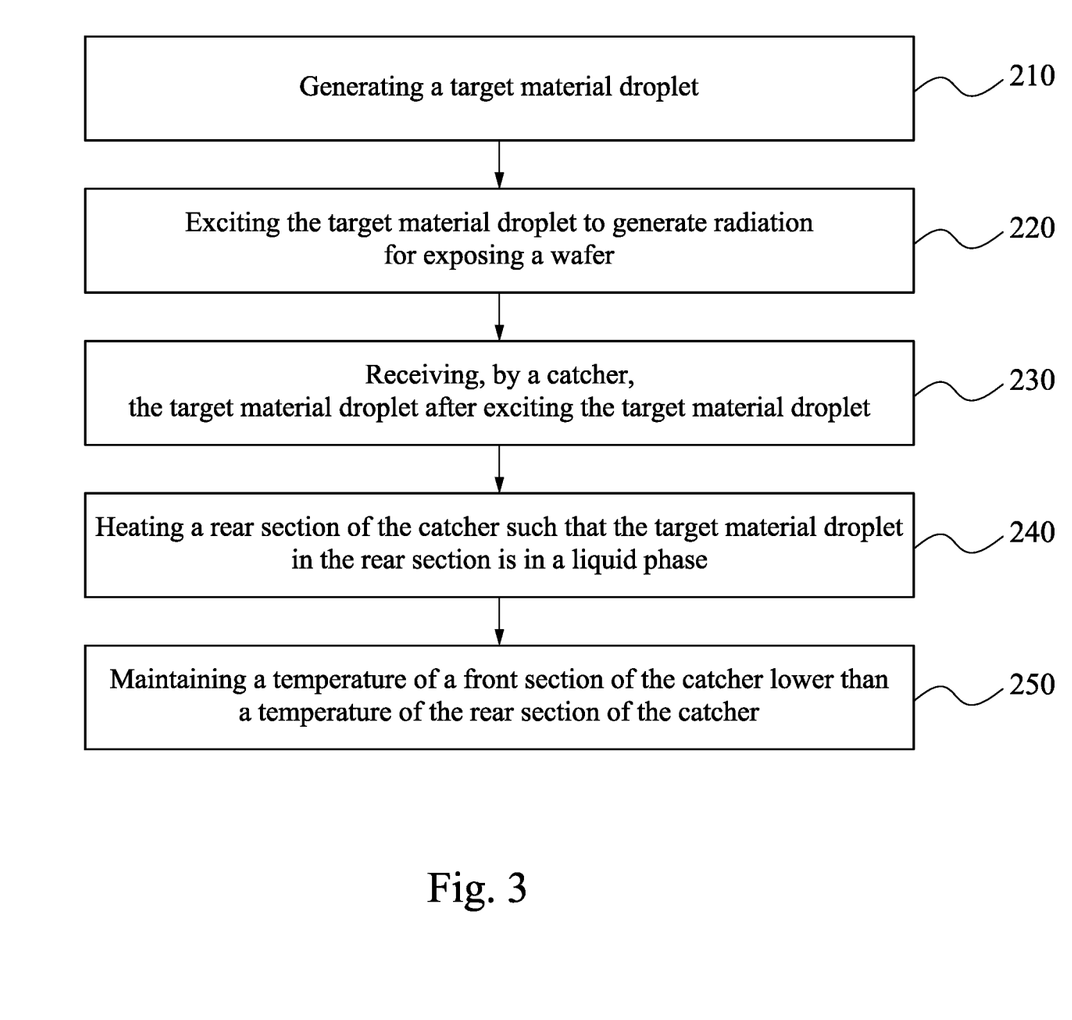
FIG. 3 is a flow chart of a method of operating a semiconductor apparatus in accordance with some embodiments of the present disclosure.

FIG. 3 is a flow chart of a method of operating a semiconductor apparatus in accordance with some embodiments of the present disclosure. The method begins with block 210 in which a target material droplet is generated. The method continues with block 220 in which the target material droplet is excited to generate radiation for exposing a wafer. The method continues with block 230 in which the target material droplet is received by a catcher after exciting the target material droplet, and the catcher has a front section, a rear section, and a drain port at the rear section. The method continues with block 240 in which the rear section of the catcher is heated such that the target material droplet in the rear section is in a liquid phase. The method continues with block 250 in which a temperature of the front section of the catcher is maintained to be lower than a temperature of the rear section of the catcher. While the method is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Reference is made to FIG. 2, the target material droplets 38 are generated by the droplet generator 110, and then the target material droplets 38 are excited to generate the radiation 40 for exposing the wafer 22 (see FIG. 1). After the target material droplets 38 are excited, the droplet catcher 120 receives the target material droplets 38. In the following description, structures of the droplet catcher 120 and a heater 130 of the semiconductor apparatus 100 and method of catching the target material droplets 38 will be described.

Figure 4:
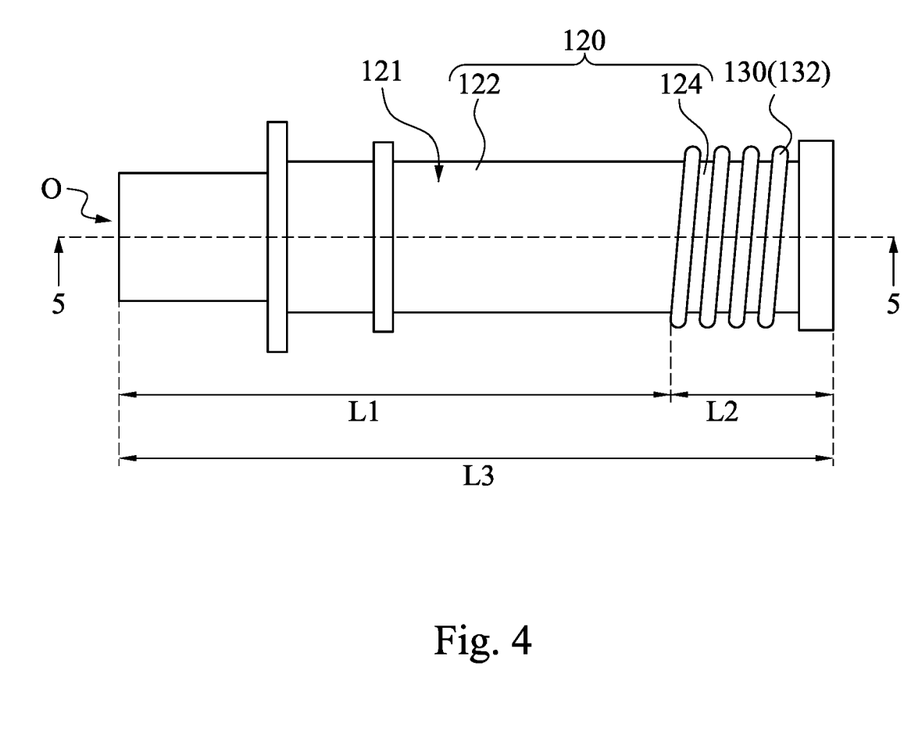
FIG. 4 is a top view of a droplet catcher and a heater of FIG. 2.

FIG. 4 is a top view of the droplet catcher 120 and the heater 130 of FIG. 2. The droplet catcher 120 includes a front section 122 and a rear section 124 that adjoins the front section 122. An end of the front section 122 distal to the rear section 124 has an opening O to receive the target material droplets 38 (see FIG. 2). The heater 130 is configured to heat the rear section 124 of the droplet catcher 120, such that the front section 122 of the droplet catcher 120 has a temperature lower than a temperature of the rear section 124 of the droplet catcher 120. In some embodiments, the heater 130 includes a heating coil 132 around an outer surface 121 of the rear section 124 of the droplet catcher 120, but the present disclosure is not limited in this regard. Moreover, in some embodiments, the front section 122 of the droplet catcher 120 has no heater thereon, and the front section 122 receives heat from the rear section 124 through heat conduction and heat radiation, which results in heat dissipation. Therefore, the temperature of the front section 122 of the droplet catcher 120 is lower than the temperature of the rear section 124 of the droplet catcher 120. In some embodiments, the temperatures of the front section 122 and the rear section 124 of the droplet catcher 120 are maintained by the heater 130.

Figure 5:
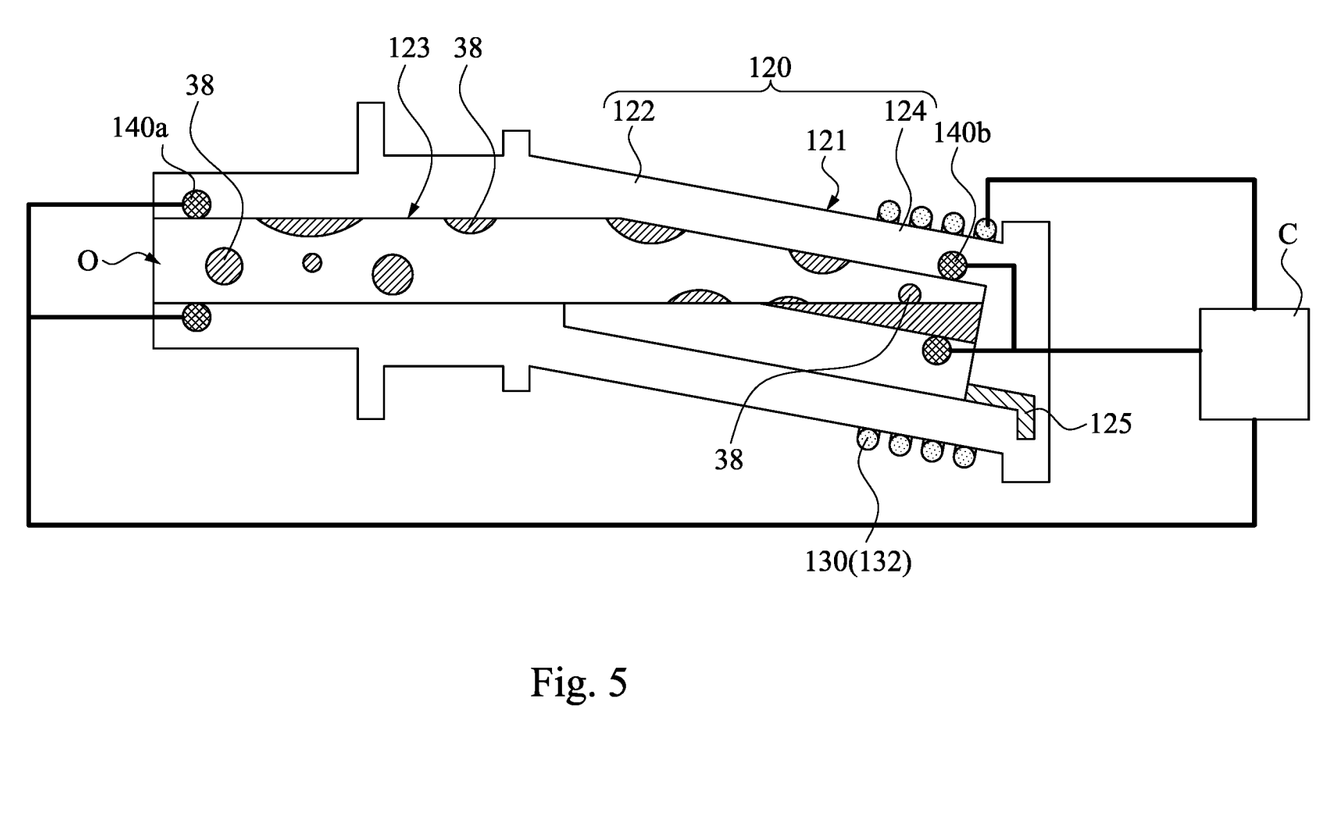
FIG. 5 is a cross-sectional view of the droplet catcher and the heater taken along line 5-5 of FIG. 4 when receiving target material droplets.

FIG. 5 is a cross-sectional view of the droplet catcher 120 and the heater 130 taken along line 5-5 of FIG. 4 when receiving the target material droplets 38. The rear section 124 of the droplet catcher 120 is heated by the heater 130 such that the target material droplets 38 in the rear section 124 are in a liquid phase. Further, the temperature of the front section 122 of the droplet catcher 120 is maintained to be lower than the temperature of the rear section 124 of the droplet catcher 120. In some embodiments, the temperature of the front section 122 of the droplet catcher 120 is higher than a melting point of the target material droplets 38. For example, the target material droplets 38 are tin droplets, and the melting point of the target material droplets 38 is in a range about 231° C. to about 232° C.

After the target material droplets 38 enter the droplet catcher 120 through the opening O, the target material droplets 38 may hit an inner surface 123 of the front section 122 of the droplet catcher 120. According to the physical property of tin, if the target material droplets 38 are tin droplets and have a temperature higher than the melting point of tin but lower than the boiling point of tin, the viscosity of the tin droplets 38 increases as the temperature of the tin droplets 38 decreases. In some embodiments, the temperature of the front section 122 of the droplet catcher 120 is lower than about 233° C. In some embodiments, the inner surface 123 of the front section 122 of the droplet catcher 120 is maintained in a temperature range from about 231.9° C. to about 233° C. Because the inner surface 123 of the front section 122 of the droplet catcher 120 is maintained in the temperature range, the target material droplets 38 can be cooled down to increase the viscosity thereof and in a liquid phase. In some embodiments, the target material droplets 38 in the front section 122 of the droplet catcher 120 have the viscosity in a range from about 1.5 mPa·s to about 2.0 mPa·s. As a result, the cooled target material droplets 38 in the front section 122 of the droplet catcher 120 have the increased viscosity, and thus the cooled target material droplets 38 can flow into the rear section 124 of the droplet catcher 120 along the inner surface 123 of the front section 122 without reversely splashing.

Moreover, the temperature of the rear section 124 of the droplet catcher 120 is lower than a boiling point of the target material droplets 38. For example, the target material droplets 38 are tin droplets, and the boiling point of the target material droplets 38 is in a range about 2602° C. to about 2603° C. After the target material droplets 38 flow into the rear section 124 of the droplet catcher 120, the target material droplets 38 attached to the inner surface 123 are near the heater 130. In some embodiments, the temperature of the rear section 124 of the droplet catcher 120 is higher than about 2600.9° C. In some embodiments, the inner surface 123 of the rear section 124 of the droplet catcher 120 is maintained in a temperature range from about 2600.9° C. to about 2601.9° C. Because the inner surface 123 of the rear section 124 of the droplet catcher 120 is maintained in the temperature range, the target material droplets 38 can be heated up to decrease the viscosity thereof and in a liquid phase. In some embodiments, the target material droplets 38 in the rear section 124 of the droplet catcher 120 have the viscosity in a range from about 0.5 mPa·s to about 1.0 mPa·s. The target material droplets 38 in the rear section 124 of the droplet catcher 120 have a lower viscosity than the target material droplets 38 in the front section 122 of the droplet catcher 120. As a result, the heated target material droplets 38 in the rear section 124 of the droplet catcher 120 have the decreased viscosity, and thus the heated target material droplets 38 can be easily collected by rear section 124 of the droplet catcher 120 due to good fluidity, thereby preventing reversely splashing.

In some embodiments, the droplet catcher 120 has a drain port 125 at the rear section 124 of the droplet catcher 120. The target material droplets 38 may be recycled from the rear section 124 of the droplet catcher 120 to the droplet generator 110 of FIG. 2 through the drain port 125.

Reference is made to FIG. 4, the front section 122 of the droplet catcher 120 is longer than the rear section 124 of the droplet catcher 120. In other words, a length L1 of the front section 122 of the droplet catcher 120 is greater than a length L2 of the rear section 124 of the droplet catcher 120. The droplet catcher 120 has a total length L3 substantially equal to the sum of the length L1 of the front section 122 and the length L2 of the rear section 124. In some embodiments, the length L1 of the front section 122 of the droplet catcher 120 is in a range from about 80% of the total length L3 to about 85% of the total length L3. On the other hand, the length L2 of the rear section 124 of the droplet catcher 120 is in a range from about 15% of the total length L3 to about 20% of the total length L3. As a result of such a configuration, the front section 122 of the droplet catcher 120 has enough distance to cool the target material droplets 38 (see FIG. 5), such that the target material droplets 38 can be prevented from reversely splashing.

Reference is made to FIG. 5, the semiconductor apparatus 100 (see FIG. 2) further includes a sensor 140a, a sensor 140b, and a controller C. The controller C is electrically connected to the sensor 140a, the sensor 140b, and the heater 130. The sensor 140a and the sensor 140b are respectively in the front section 122 and the rear section 124 of the droplet catcher 120, and are adjacent to the inner surface 123. The sensor 140a is configured to detect the temperature of the inner surface 123 of the front section 122 of the droplet catcher 120, and the sensor 140b is configured to detect the temperature of the inner surface 123 of the rear section 124 of the droplet catcher 120. The controller C is configured to control the heater 130 according to the detected temperature of the inner surface 123 of the front section 122 and the rear section 124 of the droplet catcher 120. In some embodiment, the controller C can control the heater 130 such that the inner surface 123 of the front section 122 of the droplet catcher 120 is in a temperature range from about 231.9° C. to about 233° C., and the inner surface 123 of the rear section 124 of the droplet catcher 120 is in a temperature range from about 2600.9° C. to about 2601.9° C. The number of coils of the heater 130, the length L1 of the front section 122, and the length L2 of the rear section 124 (see FIG. 4) may be varied as long as the inner surface 123 of the front section 122 and the inner surface 123 of the rear section 124 respectively have the two aforementioned temperature ranges.

It is to be noted that the connection relationships of the elements described above will not be repeated in the following description. In the following description, other types of droplet catchers will be described.

Figure 6:
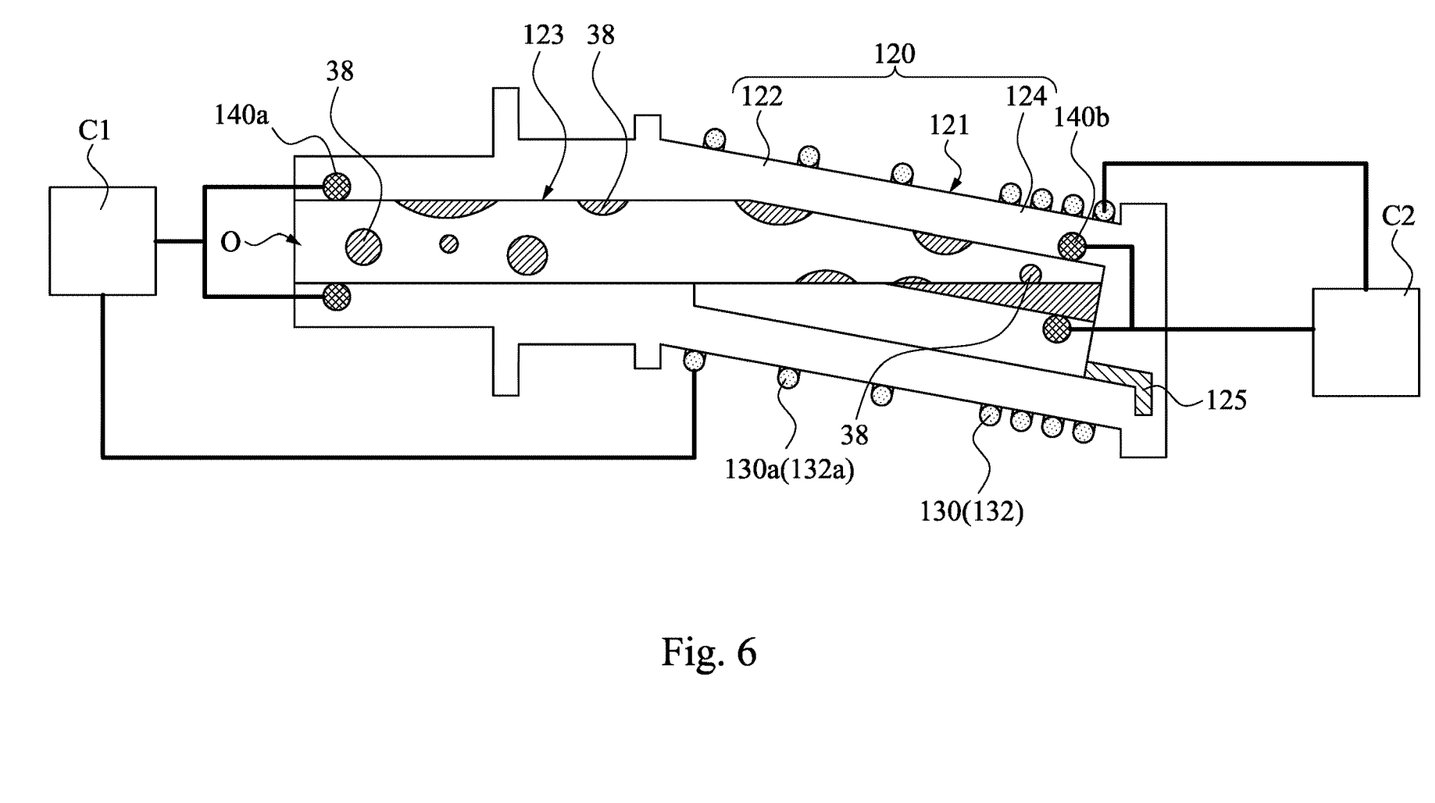
FIG. 6 is a cross-sectional view of a droplet catcher and two heaters in accordance with some embodiments of the present disclosure when receiving target material droplets.

FIG. 6 is a cross-sectional view of the droplet catcher 120 and two heaters 130 and 130a in accordance with some embodiments of the present disclosure when receiving the target material droplets 38. The semiconductor apparatus 100 (see FIG. 2) further includes the heater 130a, a controller C1, and a controller C2. The heater 130a is configured to maintain the temperature of the front section 122 of the droplet catcher 120 higher than the melting point of the target material droplets 38, but lower than the temperature of the rear section 124 of the droplet catcher 120. In some embodiments, the heater 130a includes a heating coil 132a around the outer surface 121 of the front section 122 of the droplet catcher 120. The controller C1 is electrically connected to the sensor 140a and the heater 130a, and the controller C2 is electrically connected to the sensor 140b and the heater 130. The controller C1 is configured to control the heater 130a according to the detected temperature of the inner surface 123 of the front section 122 of the droplet catcher 120, and the controller C2 is configured to control the heater 130 according to the detected temperature of the inner surface 123 of the rear section 124 of the droplet catcher 120. In some embodiment, the controller C1 can control the heater 130a such that the inner surface 123 of the front section 122 of the droplet catcher 120 is in a temperature range from about 231.9° C. to about 233° C., and the controller C2 can control the heater 130 such that the inner surface 123 of the rear section 124 of the droplet catcher 120 is in a temperature range from about 2600.9° C. to about 2601.9° C. As a result of such a configuration, the target material droplets 38 in the front section 122 of the droplet catcher 120 has a higher viscosity than the target material droplets 38 in the rear section 124 of the droplet catcher 120, thereby preventing the target material droplets 38 from reversely splashing onto the collector 36 (see FIG. 2) outside the droplet catcher 120 to cause contamination.

Figure 7:
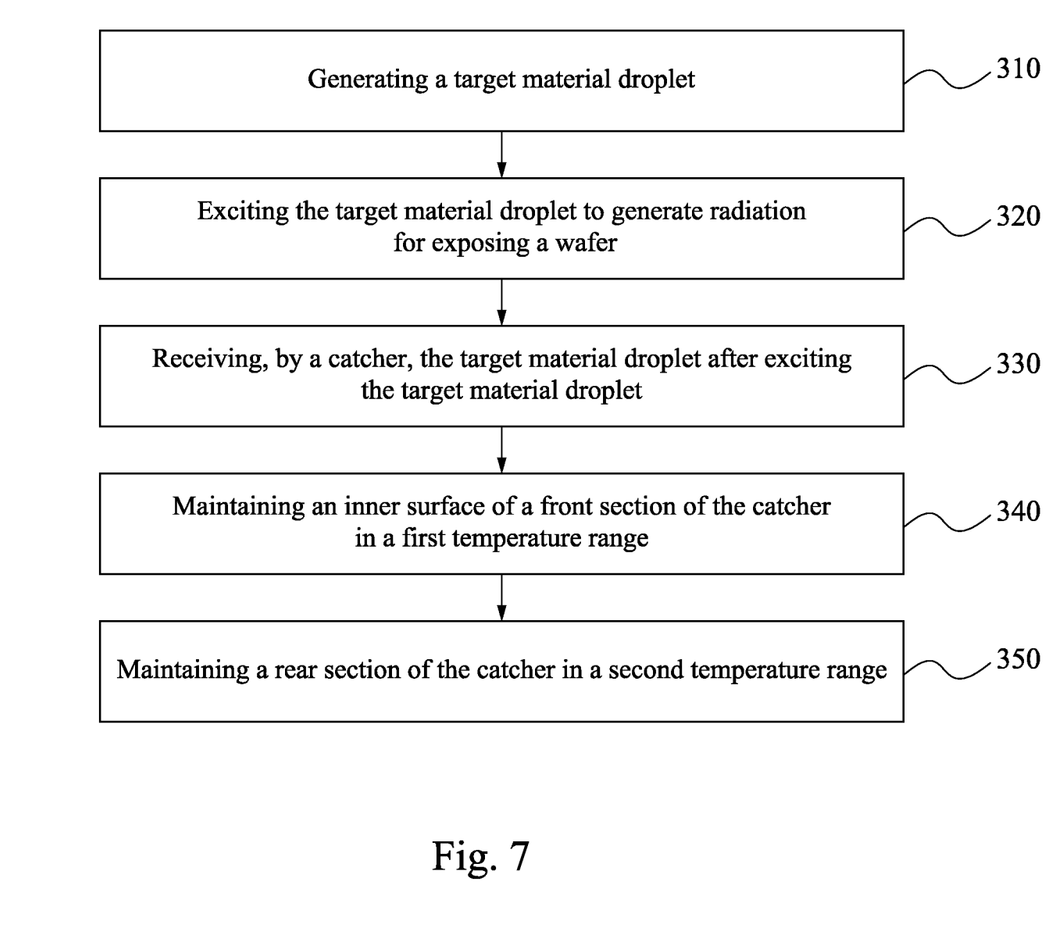
FIG. 7 is a flow chart of a method of operating a semiconductor apparatus in accordance with some embodiments of the present disclosure.

FIG. 7 is a flow chart of a method of operating a semiconductor apparatus in accordance with some embodiments of the present disclosure. The method begins with block 310 in which a target material droplet is generated. The method continues with block 320 in which the target material droplet is excited to generate radiation for exposing a wafer. The method continues with block 330 in which the target material droplet is received by a catcher after exciting the target material droplet, and the target material droplet received by the catcher hits an inner surface of a front section of the catcher and then flows into a rear section of the catcher. The method continues with block 340 in which the inner surface of the front section of the catcher is maintained in a first temperature range, such that the target material droplet is cooled down and in a liquid phase when hitting the inner surface of the front section of the catcher. The method continues with block 350 in which the rear section of the catcher is maintained in a second temperature range, such that the target material droplet is heated up and in the liquid phase when flowing into the rear section of the catcher. While the method is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 8:
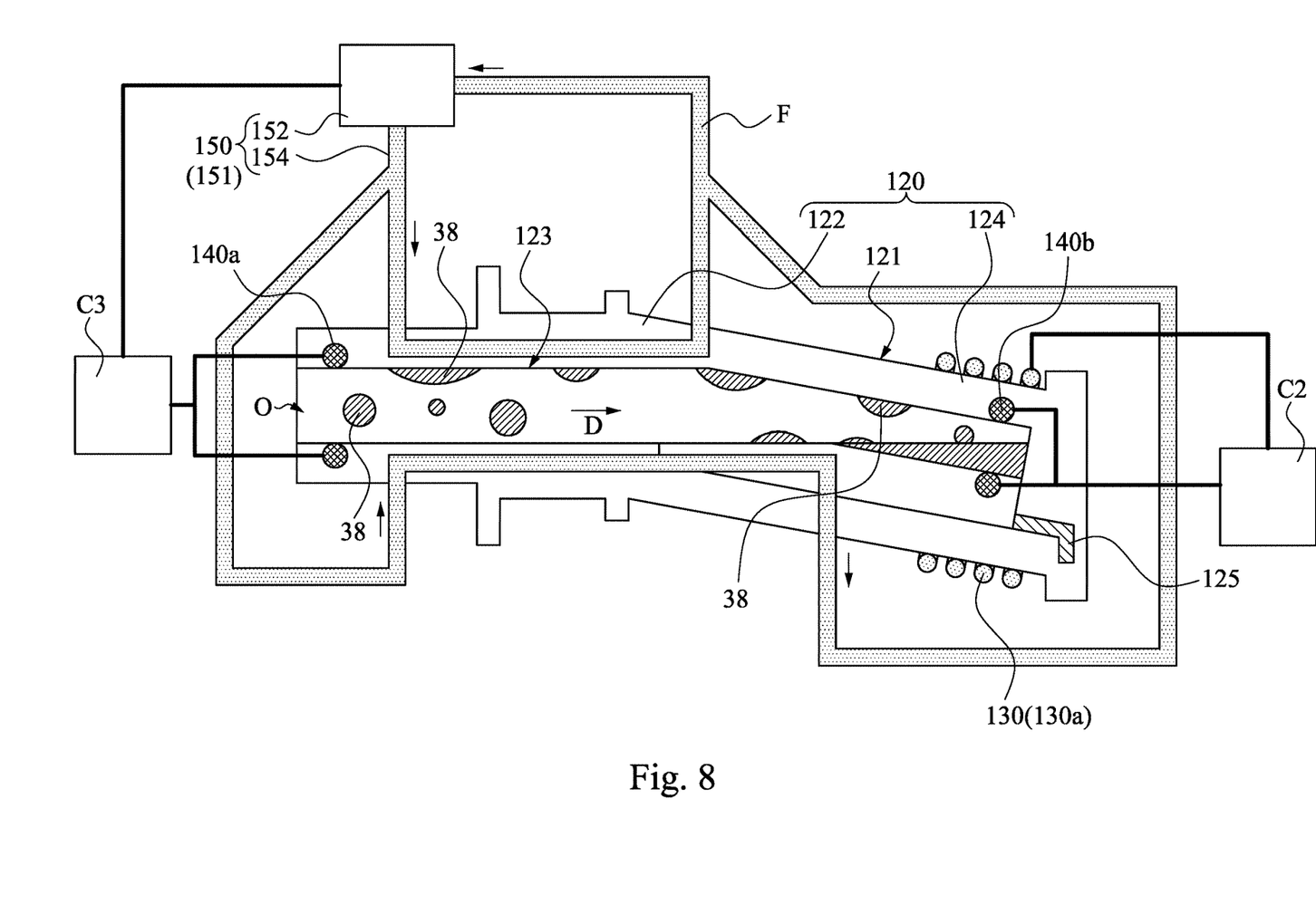
FIG. 8 is a cross-sectional view of a droplet catcher, a heater, and a cooling system in accordance with some embodiments of the present disclosure when receiving target material droplets.

FIG. 8 is a cross-sectional view of the droplet catcher 120, the heater 130, and a cooling system 150 in accordance with some embodiments of the present disclosure when receiving the target material droplets 38. The target material droplets 38 are generated by the droplet generator 110 of FIG. 2, and then the target material droplets 38 are excited to generate the radiation 40 for exposing the wafer 22 (see FIG. 1). After the target material droplets 38 are excited, the target material droplets 38 are received by the droplet catcher 120, and the target material droplets 38 hit the inner surface 123 of the front section 122 of the droplet catcher 120 and then flow into the rear section 124 of the droplet catcher 120. In some embodiments, the semiconductor apparatus 100 of FIG. 2 further includes a cooling system 150 configured to cool the front section 122 of the droplet catcher 120. The cooling system 150 may comprise a recirculating cooling liquid system 151. In some embodiments, the recirculating cooling liquid system 151 includes a pump 152, pipes 154, and working fluid F in the pipes 154. The pump 152 may be a liquid cooling pump, such as a water cooling pump. The working fluid F may be water, but the present disclosure is not limited in this regard. The pipes 154 are connected to the pump 152 and the front section 122 of the droplet catcher 120. Portions of the pipes 154 in the front section 122 of the droplet catcher 120 are disposed along the inner surface 123 of the front section 122, such as substantially parallel to the inner surface 123 of the front section 122. Furthermore, the portions of the pipes 154 in the front section 122 are adjacent to the inner surface 123 of the front section 122 for better heat dissipation rate.

As a result of such a configuration, when the pump 152 is in operation, the working fluid F can flow along the inner surface 123 of the front section 122 in a direction D, such that the inner surface 123 of the front section 122 of the droplet catcher 120 can be maintained in a temperature range, such as in the temperature range from about 231.9° C. to about 233° C. In other words, the temperature of the front section 122 of the droplet catcher 120 are maintained using the recirculating cooling liquid system 151. As a result, the target material droplets 38 are cooled down to increase the viscosity thereof and are in a liquid phase when hitting the inner surface 123 of the front section 122 of the droplet catcher 120. Accordingly, the target material droplets 38 can flow into the rear section 124 of the droplet catcher 120 along the inner surface 123 of the front section 122 due to the increased viscosity, thereby preventing the target material droplets 38 from reversely splashing onto the collector 36 (see FIG. 2) outside the droplet catcher 120 to cause contamination.

In addition, the semiconductor apparatus 100 of FIG. 2 further includes a controller C3. The controller C3 is electrically connected to the pump 152 and the sensor 140a. The sensor 140a is configured to detect the temperature of the inner surface 123 of the front section 122 of the droplet catcher 120, and the controller C3 is configured to control the cooling system 150 (e.g., the pump 152) according to the detected temperature of the inner surface 123 of the front section 122 of the droplet catcher 120. In some embodiments, when the temperature of the front section 122 of the droplet catcher 120 is higher than about 232.9° C., a cooling liquid flow rate of the recirculating cooling liquid system 151 is increased by the pump 152. On the other hand, when the temperature of the front section 122 of the droplet catcher 120 is lower than about 232° C., a cooling liquid flow rate of the recirculating cooling liquid system 151 is decreased by the pump 152.

Moreover, the rear section 124 of the droplet catcher 120 is maintained in another temperature range, such that the target material droplets 38 are heated up and in the liquid phase when flowing into the rear section 124 of the droplet catcher 120. The controller C2 is electrically connected to the sensor 140b and the heater 130, and is configured to control the heater 130 according to the temperature of the inner surface 123 of the rear section 124 detected by the sensor 140b. In some embodiment, the controller C2 can control the heater 130 such that the inner surface 123 of the rear section 124 of the droplet catcher 120 is in a temperature range from about 2600.9° C. to about 2601.9° C. The target material droplets 38 in the rear section 124 of the droplet catcher 120 have a lower viscosity than the target material droplets 38 in the front section 122 of the droplet catcher 120. As a result, the heated target material droplets 38 in the rear section 124 of the droplet catcher 120 have the decreased viscosity, and thus the heated target material droplets 38 can be easily collected by rear section 124 of the droplet catcher 120 due to good fluidity, thereby preventing reversely splashing.

In some embodiments, the droplet catcher has the front section with a low temperature and the rear section with a high temperature, in which the low temperature of the front section is higher than the melting point of the target material droplets, and the high temperature of the rear section is lower than the boiling point of the droplets. After the droplet catcher receives the target material droplets, the target material droplets hit the inner surface of the front section of the droplet catcher, such that the target material droplets have increased viscosity in the front section. Thereafter, the target material droplets can flow into the rear section along the inner surface of the front section, and are heated up in the rear section for collection, thereby preventing the target material droplets from reversely splashing.

According to some embodiments, a method of operating a semiconductor apparatus includes generating, by a droplet generator, a target material droplet; receiving, by a catcher, the target material droplet, wherein the catcher has a first section and a second section, wherein the first section of the catcher is closer to the droplet generator than the second section of the catcher; and heating the second section of the catcher, wherein the first section of the catcher is longer than the second section of the catcher and is free of a heater, and heating the second section of the catcher is performed such that a temperature of the second section of the catcher is higher than a temperature of the first section of the catcher.

According to some embodiments, a method of operating a semiconductor apparatus includes generating, by a droplet generator, a target material droplet; receiving, by a catcher, the target material droplet, wherein the catcher has a first section and a second section, wherein the first section of the catcher is closer to the droplet generator than the second section of the catcher, and the first section of the catcher is longer than the second section of the catcher; and heating, by a first heater, the first section of the catcher and heating, by a second heater, the second section of the catcher, such that a temperature of the second section of the catcher is higher than a temperature of the first section of the catcher.

According to some embodiments, a semiconductor apparatus includes a droplet generator, a droplet catcher, and a heating coil. The droplet catcher is spaced apart from the droplet generator, wherein the droplet catcher includes an oblique portion and a horizontal portion, the horizontal portion of the catcher is closer to the droplet generator than the oblique portion of the catcher, wherein the horizontal portion and the oblique portion of the droplet catcher form an obtuse angle therebetween. The heating coil is around at least a portion of the oblique portion of the droplet catcher.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not de depart from the spirit and scope of the present disclosure, and that they may make various changes, substitutions, and alterations herein without departing from the spirit and scope of the present disclosure.

What is claimed is:

1. A method, comprising:
   generating, by a droplet generator, a target material droplet;
   receiving, by a catcher, the target material droplet, wherein the catcher has a first section and a second section, wherein the first section of the catcher is closer to the droplet generator than the second section of the catcher; and
   heating the second section of the catcher, wherein the first section of the catcher is longer than the second section of the catcher and is free of a heater, and heating the second section of the catcher is performed such that a temperature of the second section of the catcher is higher than a temperature of the first section of the catcher.

2. The method of claim 1, further comprising:
   maintaining, by a recirculating cooling liquid system through the first section of the catcher, the temperature of the first section of the catcher is lower than the second section of the catcher.

3. The method of claim 2, wherein maintaining the temperature of the first section of the catcher is performed such that the temperature of the first section of the catcher is higher than a melting point of the target material droplet.

4. The method of claim 2, wherein maintaining the temperature of the first section of the catcher comprises:
increasing a cooling liquid flow rate of the recirculating cooling liquid system when the temperature of the first section of the catcher is higher than a first predetermined temperature.

5. The method of claim 4, wherein maintaining the temperature of the first section of the catcher comprises:
decreasing a cooling liquid flow rate of the recirculating cooling liquid system when the temperature of the first section of the catcher is lower than a second predetermined temperature that is lower than the first predetermined temperature.

6. The method of claim 2, further comprising:
detecting, by a temperature sensor in the first section of the catcher and electrically connected to the recirculating cooling liquid system, the temperature of the first section of the catcher.

7. The method of claim 2, wherein maintaining the temperature of the first section of the catcher lower than the second section of the catcher is performed such that the target material droplet in the first section of the catcher has a higher viscosity than the target material droplet in the second section of the catcher.

8. The method of claim 1, wherein heating the second section of the catcher is performed by a heating coil around the second section of the catcher.

9. The method of claim 8, further comprising:
detecting, by a temperature sensor in the second section of the catcher and electrically connected to the heating coil, the temperature of the second section of the catcher.

10. The method of claim 1, wherein heating the second section of the catcher is performed such that the temperature of the second section of the catcher is lower than a boiling point of the target material droplet.

11. A method, comprising:
generating, by a droplet generator, a target material droplet;
receiving, by a catcher, the target material droplet, wherein the catcher has a first section and a second section, wherein the first section of the catcher is closer to the droplet generator than the second section of the catcher, and the first section of the catcher is longer than the second section of the catcher; and
heating, by a first heater, the first section of the catcher and heating, by a second heater, the second section of the catcher, such that a temperature of the second section of the catcher is higher than a temperature of the first section of the catcher.

12. The method of claim 11, wherein heating the first and second sections of the catcher is performed such that the target material droplet in the first section of the catcher has a higher viscosity than the target material droplet in the second section of the catcher.

13. The method of claim 11, wherein heating the first section of the catcher is performed such that the target material droplet flows along an inner surface of the first section of the catcher.

14. The method of claim 11, wherein heating the second section of the catcher is performed such that the target material droplet in the second section of the catcher has a higher fluidity than the target material droplet in the first section of the catcher.

15. The method of claim 11, further comprising:
detecting, by two separated temperature sensors respectively in the first and second sections of the catcher, the temperature of the first section of the catcher and the temperature of the second section of the catcher.

16. An apparatus, comprising:
a droplet generator;
a droplet catcher spaced apart from the droplet generator, wherein the droplet catcher comprises an oblique portion and a horizontal portion, the horizontal portion of the catcher is closer to the droplet generator than the oblique portion of the catcher, wherein the horizontal portion and the oblique portion of the droplet catcher form an obtuse angle therebetween; and
a heating coil around at least a portion of the oblique portion of the droplet catcher.

17. The apparatus of claim 16, wherein the oblique portion of the droplet catcher is longer the horizontal portion of the droplet catcher.

18. The apparatus of claim 16, wherein the horizontal portion of the droplet catcher is free of a heater.

19. The apparatus of claim 16, further comprising:
a pipe having at least a portion in the horizontal portion of the droplet catcher.

20. The apparatus of claim 19, further comprising:
a pump connected to the pipe; and
a temperature sensor in the horizontal portion of the droplet catcher and electrically connected to the pump.

* * * * *